United States Patent
Shimizu et al.

(10) Patent No.: US 9,507,085 B2
(45) Date of Patent: Nov. 29, 2016

(54) OPTICAL FIBER AND OPTICAL FIBER MANUFACTURING METHOD

(71) Applicant: FUJITSU LIMITED, Kawasaki-shi, Kanagawa (JP)

(72) Inventors: Takashi Shimizu, Kawasaki (JP); Tsuyoshi Yamamoto, Atsugi (JP); Jun Matsui, Kawasaki (JP); Eiji Yoshida, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 99 days.

(21) Appl. No.: 14/515,554

(22) Filed: Oct. 16, 2014

(65) Prior Publication Data
US 2015/0147041 A1 May 28, 2015

(30) Foreign Application Priority Data

Nov. 28, 2013 (JP) .................................. 2013-246770

(51) Int. Cl.
*G02B 6/036* (2006.01)
*G02B 6/02* (2006.01)
*G02B 6/42* (2006.01)
*B29D 11/00* (2006.01)
*C23C 14/50* (2006.01)

(52) U.S. Cl.
CPC ...... *G02B 6/03694* (2013.01); *B29D 11/00663* (2013.01); *C23C 14/505* (2013.01); *G02B 6/02395* (2013.01); *G02B 6/4268* (2013.01); *G02B 6/4296* (2013.01); *B29K 2995/0013* (2013.01)

(58) Field of Classification Search
None
See application file for complete search history.

(56) References Cited

U.S. PATENT DOCUMENTS

2010/0061684 A1* 3/2010 Terada ................. G02B 6/4202 385/88

FOREIGN PATENT DOCUMENTS

JP 2013-050484 3/2013

* cited by examiner

*Primary Examiner* — Chad Smith
(74) *Attorney, Agent, or Firm* — Fujitsu Patent Center

(57) ABSTRACT

An optical fiber includes a core, a cladding, and a thermally conductive member. The cladding is formed in a surrounding of the core. The thermally conductive member is formed in a surrounding of the cladding and includes a thermal conductivity higher than thermal conductivities of the core and the cladding.

3 Claims, 3 Drawing Sheets

OPTICAL FIBER AND OPTICAL FIBER MANUFACTURING METHOD

CROSS-REFERENCE TO RELATED APPLICATION

This application is based upon and claims the benefit of priority of the prior Japanese Patent Application No. 2013-246770, filed on Nov. 28, 2013, the entire contents of which are incorporated herein by reference.

FIELD

The embodiments discussed herein are related to an optical fiber and an optical fiber manufacturing method.

BACKGROUND

In recent years, due to an increase in the speed of communication, optical interconnects are becoming popular by which two or more semiconductor devices (e.g., Central Processing Units [CPUs]) are connected to each other with an optical fiber, which achieves a higher speed and a higher level of performance than related metal wirings. In an optical interconnect structure, an electric signal that is output from a semiconductor device is first converted into an optical signal by an optical module and is subsequently output to an optical fiber. To be compliant with high-speed communication, the distance allowance between the semiconductor device and the optical module is short, e.g., approximately 10 cm. Thus, on a substrate, the optical module is disposed to be positioned either near or on the semiconductor device, which is a heat generating member. In addition, because the optical module itself generates heat due to the light emission, it is desirable that the optical module has excellent heat radiation characteristics.

Patent Document 1: Japanese Laid-open Patent Publication No. 2013-050484

However, when the optical module is installed on the substrate, the optical fiber is connected to the surface opposite to the installment surface. As for the semiconductor device, unlike the optical module, it is possible to radiate heat therefrom by installing a heat sink in an upper part thereof. However, as for the optical module, the optical fiber hinders installation of a heat sink. Accordingly, it is difficult to improve the heat radiation characteristics of the optical module. In particular, when a light emitting element included in the optical module is a Vertical Cavity Surface Emitting Laser (VCSEL) element or the like, the optical module has a structure in which a resonator is disposed in the thickness direction and therefore emits light in the vertical direction (i.e., the direction perpendicular to the horizontal plane), unlike the situation where the light emitting element is a Distributed Feed Back (DFB) laser element or the like. Thus, the optical fiber is connected to the upper surface of the optical module, and not to a lateral surface thereof. It is therefore difficult to radiate heat by installing a heat sink.

Further, VCSELs used as light emitting elements in optical modules are configured with GaAs crystals. Because a resonator is provided as described above, a VCSEL has multi-layer films formed above and below a light emitting unit (an active layer), the multi-layer films being configured to vary in refractive indexes by mixing other chemical elements with GaAs. Because the thermal conductivities of the multi-layer films are lower than that of the active layer, it is difficult for the heat generated at the light emitting unit to escape to the outside of the substrate and the like, and the heat therefore is locally present at the light emitting unit. Further, as for the optical fiber, because an optical waveguide (a core and a cladding) is formed by using $SiO_2$, and also, coating is formed by using resin, the thermal conductivity of the optical fiber is low. Consequently, the heat that is locally present at the light emitting unit does not get radiated through the optical fiber which is positioned immediately above the light emitting element having the light emitting unit, either. An increase in the temperature of the light emitting unit can be a cause of degradation of the properties and the reliability of the light emitting element, and consequently, a cause of degradation of those of the optical module.

SUMMARY

According to an aspect of the embodiments, an optical fiber includes a core, a cladding, and a thermally conductive member. The cladding is formed in a surrounding of the core. The thermally conductive member is formed in a surrounding of the cladding and includes a thermal conductivity higher than thermal conductivities of the core and the cladding.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Preferred embodiments will be explained with reference to accompanying drawings. The optical fiber and the optical fiber manufacturing method of the present disclosure are not limited to the embodiments described below.

Figure 1:
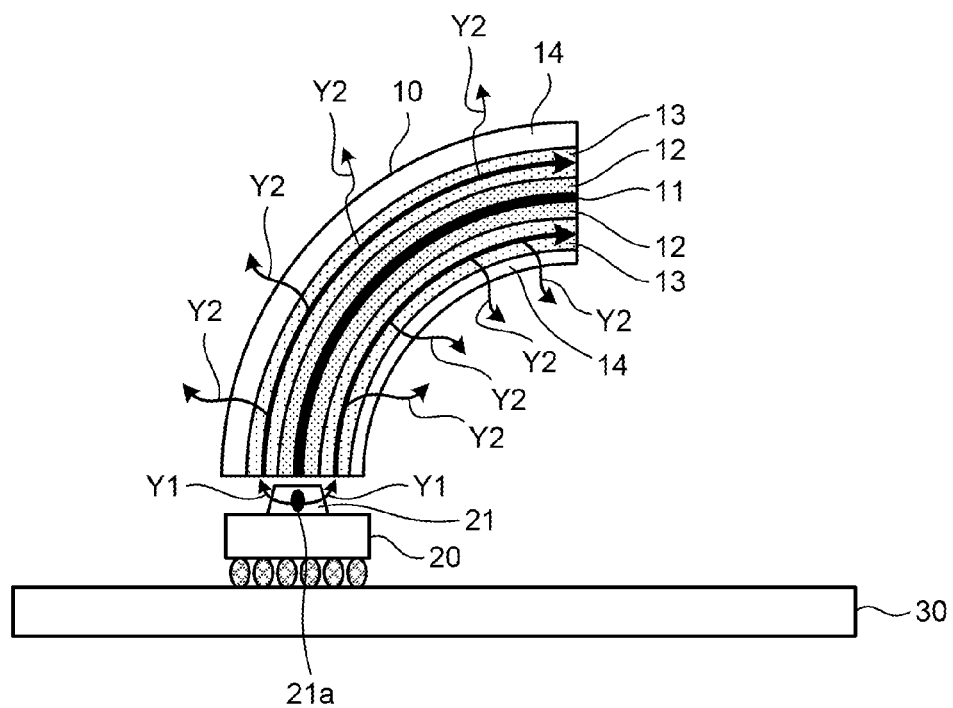
FIG. 1 is a cross-sectional view in a longitudinal direction of an optical fiber according to an embodiment.
Figure 2:
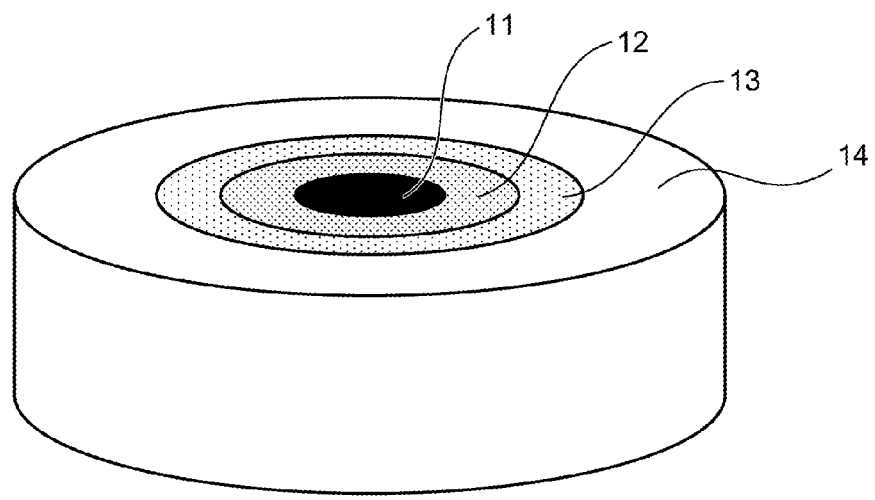
FIG. 2 is a cross-sectional view in a radial direction of the optical fiber according to the present embodiment.

First, a configuration of an optical fiber according to an embodiment of the present disclosure will be explained. FIG. 1 is a cross-sectional view in a longitudinal direction of an optical fiber 10 according to the present embodiment. As illustrated in FIG. 1, the optical fiber 10 transmits and receives, via a core 11, an optical signal to and from an optical module 20 bonded to a substrate 30 configured with a Printed Circuit Board (PCB) or the like. FIG. 2 is a cross-sectional view in a radial direction of the optical fiber 10 according to the present embodiment. As illustrated in FIG. 2, the optical fiber 10 includes the core 11, a cladding 12, a thermally conductive member 13, and a coating member 14, that are arranged from the center toward the exterior. The outside diameter of the optical fiber 10 is, for example, 600 μm. In that situation, the outside diameter of the core 11 is approximately 50 μm, whereas the outside diameter of the cladding 12 is approximately 100 μm, and the outside diameter of the thermally conductive member 13 is approximately 300 μm. Further, the coating member 14 coats the circumference of the thermally conductive member 13.

The optical module 20 has an Electrical-to-Optical (EO)/Optical-to-Electrical (OE) converting function. In other words, when a signal is transmitted from a semiconductor device to which the optical module 20 is connected, to another semiconductor device that is positioned opposite thereto, the optical module 20 converts the electric signal into an optical signal. When a signal is received from the opposite semiconductor device, the optical module 20 converts the optical signal into an electric signal.

Returning to the description of FIG. 1, heat of a light emitting unit 21a that is positioned near the center of a light emitting element 21 configured with a VCSEL or the like propagates through air as indicated with arrows Y1 and is conducted to the thermally conductive member 13. Air has a thermal conductivity lower than those of organic matters and the like. Of the constituent elements of the optical fiber 10, the thermally conductive member 13 has a thermal conductivity higher than those of the other members. Thus, if the gap between the bottom face of the optical fiber 10 and the top face of the light emitting element 21 is small (e.g., 1 to 5 μm), the heat of the light emitting unit 21a is efficiently absorbed by the thermally conductive member 13 via the air. The heat that has reached the thermally conductive member 13 is released into the air, as indicated with arrows Y2, via the thermally conductive member 13 and the coating member 14 extending upward. With this arrangement, the optical fiber 10 achieves a heat radiating effect that is approximately 1.3 times larger than that achieved by a related optical fiber which does not include the thermally conductive member 13.

It is desirable to arrange the optical fiber 10 so as not to be in contact with the light emitting element 21 for the purpose of avoiding damaging the optical fiber 10 with a stress or the like that may be caused by the light emitting element 21 when in contact. However, the optical fiber 10 and the light emitting element 21 do not necessarily have to be out of contact with each other.

The optical fiber 10 is configured so that light is confined within the core 11 on account of the difference in the refractive indices between the core 11 and the cladding 12. In addition, provided on the outside thereof is the thermally conductive member 13 that is a medium having a high thermal conductivity. The thermally conductive member 13 has a thermal conductivity that is approximately 10 times higher than those of the core 11 and the cladding 12. Further, because the thermally conductive member 13 is in contact with the cladding 12, the thermally conductive member 13 is realized by using one or more materials (e.g., a transparent material) that do not affect light transmitting characteristics of the optical fiber 10. More specifically, the thermally conductive member 13 is realized by using, for example, indium tin oxide (ITO), zinc oxide (ZnO), or one or more other organic materials. Further, the coating member 14 is realized by using, for example, an ultraviolet curable resin or the like and enhances the mechanical strength of the optical fiber 10.

In the optical module 20, the heat generated by the light emitting unit 21a (a VCSEL active layer) would normally stagnate within the light emitting element 21, because of covering by the medium having a low thermal conductivity. However, because the thermally conductive member 13 having a high thermal conductivity is present near the light emitting unit 21a, the optical module 20 is able to cause the heat of the light emitting unit 21a to escape via the thermally conductive member 13. As illustrated in FIG. 1, the heat absorbed by the thermally conductive member 13 from the light emitting unit 21a is conducted along the longitudinal direction of the optical fiber 10 and is gradually dispersed into the air through the coating member 14. As a result, it is possible to realize efficient heat exhaustion and to improve the reliability of the light emitting element 21 and to thereby improve the reliability of the optical module 20.

As explained above, the optical fiber 10 includes the core 11, the cladding 12, and the thermally conductive member 13. The core 11 is provided so as to extend in the longitudinal direction of the optical fiber 10 and serves as the optical waveguide. The cladding 12 is formed in the surrounding of the core 11. The thermally conductive member 13 is formed in the surrounding of the cladding 12 and has a thermal conductivity higher than those of the core 11 and the cladding 12. Accordingly, the optical fiber 10 is able to release the heat generated by the light emitting element 21 included in the optical module 20 to which the optical fiber 10 is connected, into the air from the optical fiber 10 via the thermally conductive member 13. As a result, it is possible to improve the heat radiation characteristics of the light emitting element 21 included in the optical module 20.

Next, modification examples of the embodiment described above will be explained, with reference to FIGS. 3 and 4.

[b] First Modification Example

Figure 3:
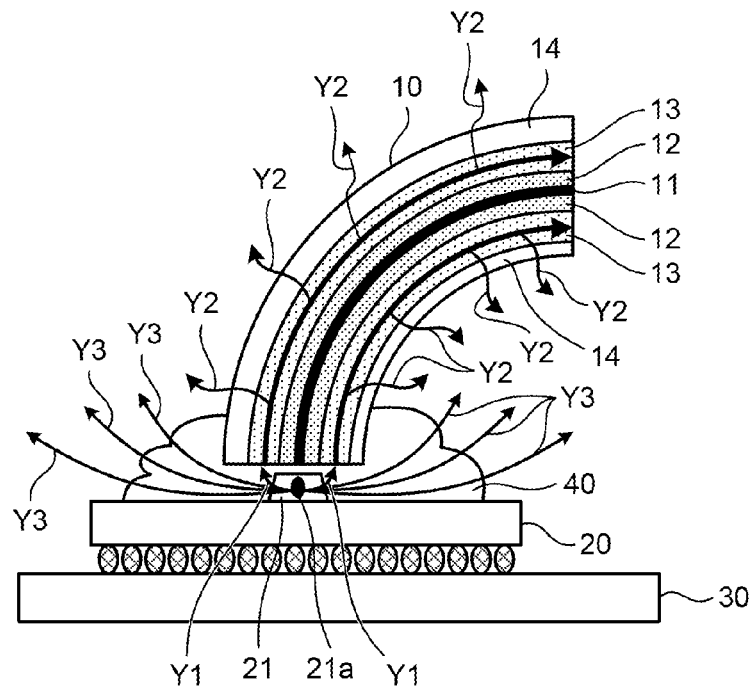
FIG. 3 is a drawing of a connection part between an optical fiber and an optical module according to a first modification example.

A first modification example will be explained below. FIG. 3 is a drawing of a connection part between the optical fiber 10 and the optical module 20 according to a first modification example. As illustrated in FIG. 3, the configuration according to the first modification example is the same as the configuration according to the embodiment illustrated in FIGS. 1 and 2, except that the space between the optical fiber 10 and the optical module 20 is filled with resin. Accordingly, in the first modification example, some of the constituent elements that are the same as those in the embodiment described above will be referred to by using the same reference characters, and drawings and detailed explanation thereof will be omitted.

The first modification example is different from the embodiment described above because of the connection part between the optical fiber 10 and the optical module 20. More specifically, in the embodiment described above, there is a gap of a number of micrometers between the optical fiber 10 and the optical module 20, so that the heat of the light emitting unit 21a propagates across the gap and reaches the thermally conductive member 13. In contrast, in the first modification example, the optical fiber 10 and the optical module 20 are fixed by using optical adhesive agent such as ultraviolet curable resin 40. In other words, the space between the optical fiber 10 and the light emitting element 21 is filled with the ultraviolet curable resin 40.

As explained above, the thermally conductive member 13 included in the optical fiber 10 according to the first modification example is connected, via the ultraviolet curable resin 40, to the optical module 20 including the light emitting element 21 that transmits light to the core 11. As a result, the heat of the light emitting unit 21a of the light emitting element 21 is released into the air not only via the thermally conductive member 13 but also via the ultraviolet curable resin 40, as indicated with arrows Y3. Accordingly, the heat radiation efficiency of the light emitting element 21 is further improved. Furthermore, from the aspect of the surface area, the surface area used for the heat radiation in the configuration according to the first modification example is larger than that in the configuration according to the embodiment described above, due to the filling with the ultraviolet curable resin 40. As a result, the heat radiation efficiency is further improved.

In addition, the thermal conductivity of the ultraviolet curable resin 40 is higher than the thermal conductivity of convection or radiation of air. Thus, in the configuration according to the first modification example, the heat of the light emitting unit 21a is more easily conducted, via the ultraviolet curable resin 40, to the thermally conductive member 13 included in the optical fiber 10 than in the configuration according to the embodiment described above. This also makes it possible to achieve a large heat radiating effect.

[c] Second Modification Example

Figure 4:
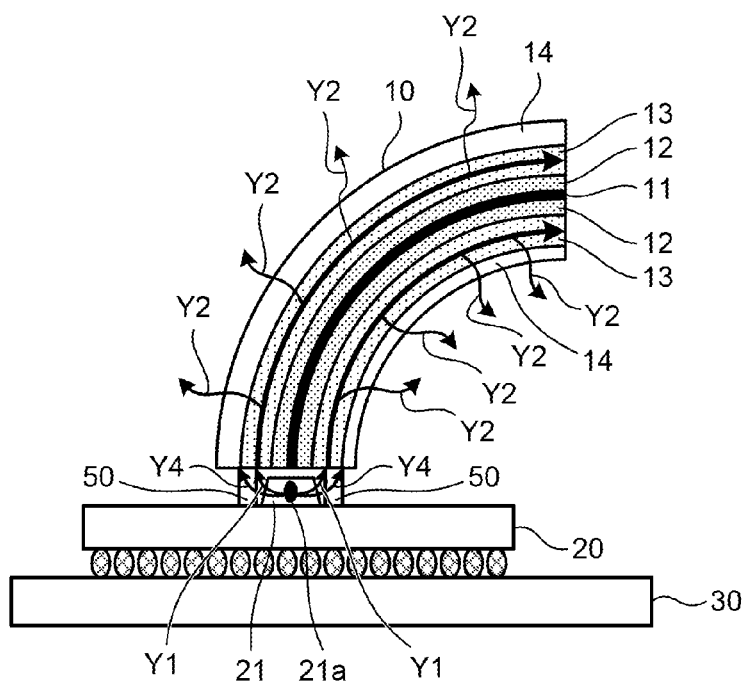
FIG. 4 is a drawing of a connection part between an optical fiber and an optical module according to a second modification example.

Next, a second modification example will be explained. FIG. 4 is a drawing of a connection part between the optical fiber 10 and the optical module 20 according to the second modification example. As illustrated in FIG. 4, the configuration according to the second modification example is the same as the configuration according to the embodiment illustrated in FIGS. 1 and 2, except that one or more auxiliary members are interposed between the optical fiber 10 and the optical module 20. Accordingly, in the second modification example, some of the constituent elements that are the same as those in the embodiment described above will be referred to by using the same reference characters, and drawings and detailed explanation thereof will be omitted.

The second modification example is different from the embodiment described above because of the connection part between the optical fiber 10 and the optical module 20. More specifically, in the embodiment described above, there is a gap of a number of micrometers between the optical fiber 10 and the optical module 20, so that the heat of the light emitting unit 21a propagates across the gap and reaches the thermally conductive member 13. In contrast, in the second modification example, the optical fiber 10 and the optical module 20 are connected to each other, not only by air but also by one or more auxiliary members 50.

As explained above, the thermally conductive member 13 included in the optical fiber 10 according to the second modification example is connected to the optical module 20 including the light emitting element 21 that transmits light to the core 11, via the one or more auxiliary members 50 that are each provided in a position lateral to the light emitting element 21. As a result, the heat of the light emitting unit 21a of the light emitting element 21 propagates to the thermally conductive member 13 not only by the propagation through the air, but also via the one or more auxiliary members 50, as indicated with arrows Y4. Accordingly, the heat radiation efficiency of the light emitting element 21 is further improved.

For the purpose of not affecting the high-speed signal wiring of the light emitting element 21, the one or more auxiliary members 50 are configured by using, for example, alumina ceramics, SiC, ITO, ZnO, one or more other organic materials, or ultraviolet curable resin. The thermal conductivity of the one or more auxiliary members 50 is higher than the thermal conductivity of air. Thus, in the configuration according to the second modification example, the heat of the light emitting unit 21a is more easily conducted, via the one or more auxiliary members 50, to the thermally conductive member 13 included in the optical fiber 10 than in the configuration according to the embodiment described above. In other words, the optical fiber 10 according to the second modification example is able to cause the heat to be efficiently conducted from the light emitting unit 21a of the optical module 20 to the part of the optical fiber 10 having a high thermal conductivity. As a result, it is possible to achieve a large heat radiating effect.

One auxiliary member 50 in the shape of a round tube, for example, may be provided along the outer perimeter of the light emitting element 21 so as to surround the circumference of the light emitting element 21. Alternatively, two or more (e.g., two to eight) auxiliary members 50 that are each in the shape of a circular or quadrangular pillar, for example, may be provided separately from one another, in the surroundings of the light emitting element 21. However, it is noted that, for the purpose of not affecting (e.g., blocking or causing a refractive reflection in) the light emitted by the light emitting element 21, it is desirable to provide the one or more auxiliary members 50 in one or more positions lateral to the light emitting element 21, and not in positions above the light emitting element 21.

Further, the structure according to the first modification example (filled with the resin) and the structure according to the second modification example (using the one or more auxiliary members) do not necessarily have to be applied mutually exclusively. The pair made up of the optical fiber 10 and the optical module 20 may have both of the structures together.

A Manufacturing Method of the Optical Fiber

Figure 5:
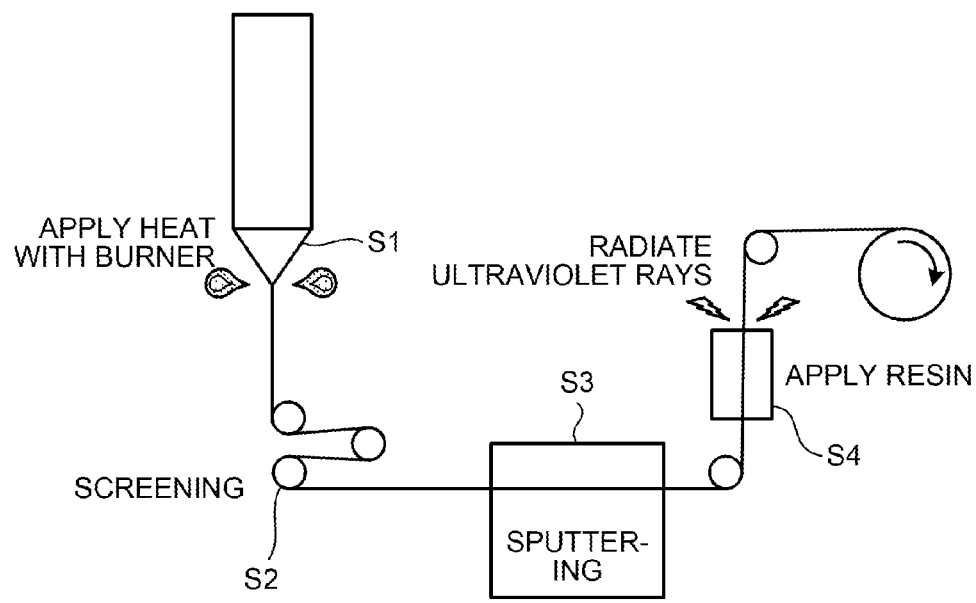
FIG. 5 is a drawing for explaining a manufacturing method of the optical fiber according to the present embodiment.

Next, a manufacturing method of the optical fiber 10 according to the embodiment described above will be explained. FIG. 5 is a drawing for explaining the manufacturing method of the optical fiber 10 according to the present embodiment. As illustrated in FIG. 5, first, an end of preform, which is a base material of the optical fiber 10, is heated with a burner (step S1). Subsequently, the part melted by the heat is pulled so as to be shaped into the form of a thread, before a screening process (a strength test) is performed thereon while being twisted (step S2).

At step S3, the thermally conductive member 13 is formed on the outside of the cladding 12, by depositing ITO, ZnO, one or more other organic materials, or the like on the surface of the optical fiber 10 through a sputtering process or a vacuum deposition process. At that time, for the purpose of depositing the base material of the thermally conductive member 13 uniformly in a coaxial direction of the optical fiber 10, it is desirable to deposit the base material while the optical fiber 10 is being twisted. At step S4, the coating member 14 is formed by applying resin to the farther outside of the thermally conductive member 13 and radiating ultraviolet rays. As a result, it is possible to obtain the optical fiber 10 that has an improved thermal conductivity, without affecting the light transmitting characteristics of the optical fiber 10.

As illustrated in FIG. 1, the optical fiber 10 is positioned immediately above the light emitting element 21, and an adjustment is made so that the light emitted by the light emitting unit 21a of the light emitting element 21 is joined to the core 11 of the optical fiber 10. For example, when the core diameter of the optical fiber 10 is 50 µm, while the opening diameter of the light emitting element 21 is 30 µm, and the numerical aperture is 0.05, the distance between the light emitting element 21 and the optical fiber 10 may be in the range from 10 µm to 50 µm or smaller, for example. However, in consideration of the thermal conductivity, it is desirable to arrange, as described above, the distance between the light emitting element 21 and the optical fiber 10 to be, for example, in the range from 1 µm to 5 µm approximately. The numerical aperture indicates the degree of spreading of the light emitted by the light emitting unit 21a. If the light is emitted perpendicularly, the numerical aperture is "0" because the light does not spread. With this arrangement, the optical module 20 is able to have the medium having excellent heat radiation characteristics disposed near the light emitting unit 21a, so that it is possible to exhaust the heat while using the optical fiber 10 as a substitution for a heat sink.

Next, the sputtering step will be explained. Because a sputtering step is used, for example, in the manufacture of semiconductor manufacturing apparatuses, recording media, projection apparatuses, and the like, detailed explanation thereof will be omitted. A sputtering step is a step at which, in a low-pressure argon atmosphere, argon is ionized by an ionization action such as a plasma discharge, an arc discharge, or the like. At the sputtering step, argon ions are accelerated by an electric field generated by applying a voltage to the material to be deposited (e.g., ITO, ZnO, or the like) or by a magnetic field of a magnet or the like, so that the argon ions collide with the abovementioned material serving as a target. As a result of the collision, small particles of the abovementioned material are generated. Thus, by positioning the core 11 and the cladding 12 near the abovementioned material, the small particles (sputtered atoms) of the abovementioned material are deposited on the surface of the cladding 12. As a result, the optical fiber 10 is coated by the abovementioned material, i.e., the thermally conductive member 13.

The abovementioned material structuring the thermally conductive member 13 has a melting point that is higher than that of the glass structuring the core 11 and the cladding 12. Thus, the abovementioned material does not get completely liquefied. For this reason, as described above, in order to deposit the abovementioned material, the method (i.e., the sputtering step) by which the material is sputtered in the form of particles is used instead of a heating process.

Figure 6:
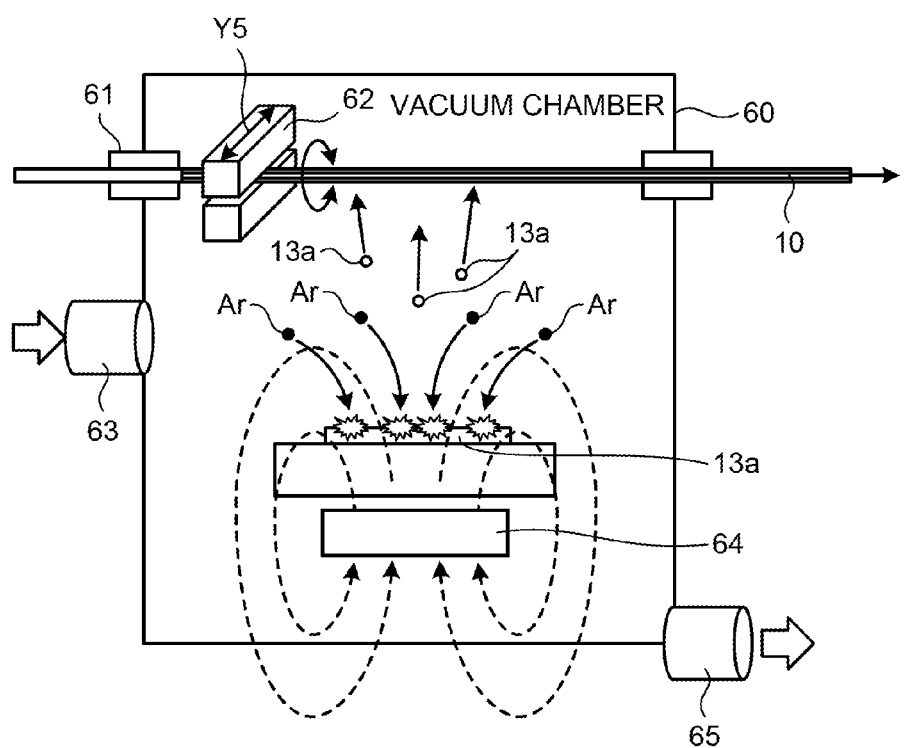
FIG. 6 is a drawing for explaining a sputtering step included in the manufacturing method of the optical fiber according to the present embodiment.

Next, the sputtering step will be explained further in detail, with reference to FIG. 6. FIG. 6 is a drawing for explaining the sputtering step included in the manufacturing method of the optical fiber 10 according to the present embodiment. As illustrated in FIG. 6, the optical fiber 10 without the thermally conductive member 13 is introduced through a fiber introduction part 61 of a vacuum chamber 60, while an airtight state is maintained. At the fiber introduction part 61, because the optical fiber 10 is introduced through an O-ring made of an elastic material such as rubber, the optical fiber 10 closely adheres to the fiber introduction part 61, so that the airtight state (vacuum) inside the vacuum chamber 60 is maintained. The optical fiber 10 introduced into the vacuum chamber 60 through the fiber introduction part 61 is pinched by a rotating mechanism 62. Because the rotating mechanism 62 reciprocates in directions perpendicular to the optical fiber 10 (the directions indicated with arrow Y5). In conjunction with this reciprocating movement, the optical fiber 10 rotates axially.

The argon ions (Ar) introduced through a gas introduction part 63 are accelerated by an ion accelerating unit 64, and subsequently collide, at a high speed, with a thermally conductive substance 13a (e.g., ITO, ZnO, one or more other organic materials, or the like) that is the base material of the thermally conductive member 13 and that serves as the target. As a result of the collision, the thermally conductive substance 13a is sputtered toward the optical fiber 10. Because the optical fiber 10 is axially rotating, the thermally conductive substance 13a is uniformly deposited on the surface of the optical fiber 10 (on the outside of the cladding 12). As a result, the optical fiber 10 is coated by the thermally conductive member 13 at the sputtering step.

As explained above, the manufacturing method of the optical fiber 10 includes the step of forming the core 11 that serves as the optical waveguide and the step of forming the cladding 12 in the surrounding of the core 11. Also, the manufacturing method of the optical fiber 10 further includes the step of forming the thermally conductive member 13 in the surrounding of the cladding 12, by depositing the substance 13a having a thermal conductivity higher than those of the core 11 and the cladding 12. As a result, it is possible to manufacture the optical fiber 10 that is able to release the heat generated by the light emitting element 21 included in the optical module 20 into the air, via the thermally conductive member 13.

The embodiment above and the modification examples are explained on the assumption that the optical fiber 10 is applied to an optical interconnect structure; however, the optical fiber 10 does not necessarily have to be used for connecting semiconductor devices to each other. For example, the optical fiber 10 may be used as a transmission path between optical transmission devices.

Further, the optical module 20 that is thermally connected to the optical fiber 10 does not necessarily have to be installed directly on the substrate 30. The optical module 20 may be installed on a processor such as a CPU, a Field Programmable Gate Array (FPGA), a Digital Signal Processor (DSP), or the like.

Further, in the embodiment described above and the modification examples, the optical fiber 10 includes the coating member 14. However, the coating member 14 may be omitted. For example, the optical fiber 10 may be configured so that the thermally conductive member 13 is formed thicker (e.g., 100 to 600 µm thick), in place of the coating member 14. Alternatively, for the purpose of preventing light from leaking from the core 11 and the cladding 12, the optical fiber 10 may be coated by a metal member. From the aspect of maintaining the light transmitting characteristics of the optical fiber 10, it is desirable to provide the coating by the metal member in such a position so as not to be in contact with the cladding 12. In other words, it is desirable that the coating by the metal member be provided between the thermally conductive member 13 and the coating member 14 or on the outside of the coating member 14.

Further, because the light emitting unit 21a where the heat is locally present is positioned at the center of the light emitting element 21, it would be optimal to arrange the thermally conductive member 13 to be positioned on the central axis (the positions of the core 11 and the cladding 12) of the optical fiber 10, from the aspect of improving the heat radiation characteristics. However, the core 11 and the cladding 12 of the optical fiber 10 are normally configured by using glass that has a lower thermal conductivity than that of the thermally conductive member 13, to make it possible to control the refractive index of the light with a high level of precision. Accordingly, it is effective to provide the thermally conductive member 13 near the central axis of the optical fiber 10, from the aspect of improving the heat radiation characteristics. In the present embodiment, however, because the core 11 and the cladding 12 are present at the central axis of the optical fiber 10, the thermally conductive member 13 is provided so as to be in contact with the outside of the cladding 12. It is noted, however, that the thermally conductive member 13 does not necessarily have to be in contact with the cladding 12. The coating member 14 or other metal member may be interposed between the cladding 12 and the thermally conductive member 13.

Further, the coating by the thermally conductive member 13 does not necessarily have to be provided for the entire length in the longitudinal direction of the optical fiber 10. For example, if the entire length of the optical fiber 10 is 300 m, the core 11 and the cladding 12 do not necessarily have to be coated by the thermally conductive member 13 for the 300 m. In other words, it is acceptable to arrange only such parts (e.g., having a length of approximately 10 to 100 m) of the core 11 and the cladding 12 of the optical fiber 10 that are positioned near the optical module 20 to be coated by the thermally conductive member 13. With this arrangement, it is possible to configure the optical fiber 10 while reducing the usage amount of the thermally conductive member 13 and the cost related to the usage thereof, without impeding the effort to improve the heat radiation characteristics.

The optical fiber 10 according to the embodiment described above and the modification examples is suitable for an application to such an optical module (e.g., an optical module having a light emitting element configured with a VCSEL or the like) that emits light in the vertical direction and that would find it difficult to radiate heat by having a heat sink installed therewith. However, the optical fiber 10 does not necessarily have to be applied to an optical module having such a structure. For example, it is acceptable to arrange the light emission heat to be released, into the air, from an optical module that emits light in a horizontal direction such as a DFB laser, via the thermally conductive member 13.

Further, although the single optical module 20 is installed on the substrate 30 in the embodiment described above and the modification examples, two or more optical modules 20 may be installed. Further, the quantity of light emitting elements 21 included in the optical module 20 does not have to be one and may be two or more (e.g., forty light emitting elements per unit optical module.) In that situation, the optical fiber 10 is connected to each of the plurality of light emitting elements 21 included in the optical module 20. However, the modes of connection thereof do not necessarily have to be uniform. In other words, to connect each of the light emitting elements 21 included in the optical module 20 to a corresponding optical fiber 10, the embodiment described above and the modification examples may be used in combination. To combine the embodiment and the modification examples, not only two but three may be combined together.

By using the optical fiber according to one aspect of the present disclosure, it is possible to improve the heat radiation characteristics of the optical module.

All examples and conditional language recited herein are intended for pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An optical fiber comprising:
    a core;
    a cladding formed in a surrounding of the core; and
    a thermally conductive member that is formed in a surrounding of the cladding and includes a thermal conductivity higher than thermal conductivities of the core and the cladding, wherein
    the thermally conductive member is connected to an optical module including a light emitting element that transmits light to the core, via an auxiliary member that is provided in a position lateral to the light emitting element, wherein
    the auxiliary member is in the shape of a round tube and is provided along an outer perimeter of the light emitting element so as to surround a circumference of the light emitting element, and
    the auxiliary member is provided in the position lateral to the light emitting element, and not in a position above the light emitting element so as not to affect the light emitted by the light emitting element.

2. The optical fiber according to claim 1, wherein the thermally conductive member is connected, via resin, to the optical module including the light emitting element that transmits light to the core.

3. An optical fiber manufacturing method comprising:
    first forming a core that serves as an optical waveguide;
    second forming a cladding in a surrounding of the core; and
    third forming a thermally conductive member in a surrounding of the cladding, by depositing a substance including a thermal conductivity higher than thermal conductivities of the core and the cladding, wherein
    the thermally conductive member is connected to an optical module including a light emitting element that transmits light to the core, via an auxiliary member that is provided in a position lateral to the light emitting element, wherein
    the auxiliary member is in the shape of a round tube and is provided along an outer perimeter of the light emitting element so as to surround a circumference of the light emitting element, and
    the auxiliary member is provided in the position lateral to the light emitting element, and not in a position above the light emitting element so as not to affect the light emitted by the light emitting element.

* * * * *